United States Patent
Kanasaki et al.

(10) Patent No.: US 6,859,352 B1
(45) Date of Patent: Feb. 22, 2005

(54) CAPACITOR SHEET

(75) Inventors: Katsumi Kanasaki, Kawasaki (JP);
Hirofumi Imabayashi, Kawasaki (JP);
Takehide Miyazaki, Kawasaki (JP);
Akira Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/878,919

(22) Filed: Jun. 28, 2004

(30) Foreign Application Priority Data

Feb. 19, 2004 (JP) ........................ 2004-042877

(51) Int. Cl.$^7$ .................................. H01G 4/35
(52) U.S. Cl. ................ 361/302; 361/303; 361/301.4; 361/306.2; 361/306.1; 361/328
(58) Field of Search ............... 361/302, 303, 361/305, 301.4, 306.1, 306.2, 308.1, 308.3, 311, 313, 321.1, 321.6, 328, 329

(56) References Cited

U.S. PATENT DOCUMENTS

| | | | | |
|---|---|---|---|---|
| 5,428,499 A | * | 6/1995 | Szerlip et al. | 361/328 |
| 6,040,229 A | * | 3/2000 | Kuriyama | 438/396 |
| 6,198,619 B1 | * | 3/2001 | Fujioka | 361/328 |
| 6,614,645 B1 | * | 9/2003 | Sakurai et al. | 361/328 |
| 6,625,006 B1 | * | 9/2003 | Aram et al. | 361/313 |

FOREIGN PATENT DOCUMENTS

| | | |
|---|---|---|
| JP | 07-321585 | 12/1995 |
| JP | 08-181445 | 7/1996 |
| JP | 09-010242 | 1/1997 |
| JP | 9-102432 | 4/1997 |
| JP | 10-322022 | 12/1998 |
| JP | 2003-124430 | 4/2003 |

* cited by examiner

*Primary Examiner*—Dean A. Reichard
*Assistant Examiner*—Nguyen T. Ha
(74) *Attorney, Agent, or Firm*—Katten Muchin Zavis Rosenman (57) ABSTRACT

A capacitor sheet comprises a plurality of first capacitor blocks connecting signal/power supply electrodes of two circuit boards with through-hole electrodes, and having grounding electrodes sandwiching dielectrics around the through-hole electrodes, and a plurality of second capacitor blocks connecting the grounding electrodes in two circuit boards with the through-hole electrodes, and having the grounding electrodes sandwiching the dielectrics around the through-hole electrodes, wherein the through-hole electrodes and the grounding electrodes are connected with pattern wirings. The capacitor blocks are arranged so that the grounding electrodes in the first capacitor blocks are electrically connected to the grounding electrodes of the second capacitor blocks to be combined to a single piece.

10 Claims, 13 Drawing Sheets

THROUGH-HOLE ELECTRODE (LARGE) 2

DIELECTRIC BLOCK 1

3 GROUNDING ELECTRODE

FIG.9B

THROUGH-HOLE ELECTRODE (LARGE) 2
PATTERN WIRING 4

DIELECTRIC BLOCK 1

3 GROUNDING ELECTRODE

FIG.9C

THROUGH-HOLE ELECTRODE (SMALL) 2

DIELECTRIC BLOCK 1

3 GROUNDING ELECTRODE

PRIOR ART

PRIOR ART

CAPACITOR SHEET

BACKGROUND OF THE INVENTION

1. Field of the Invention

The present invention relates to a capacitor sheet, and in particular to a capacitor sheet for removing noises of an LSI or the like on a circuit substrate in a general electronic apparatus such as a communication apparatus or equipment.

2. Description of the Related Art

In order to suppress noises emitted from a circuit substrate and to stabilize a signal waveform, an electronic part such as an IC or an LSI mounted on the circuit substrate mounts a capacitor in the vicinity between a power supply pin and a ground of the IC, the LSI, or the like, for the power supply.

Figure 12A:
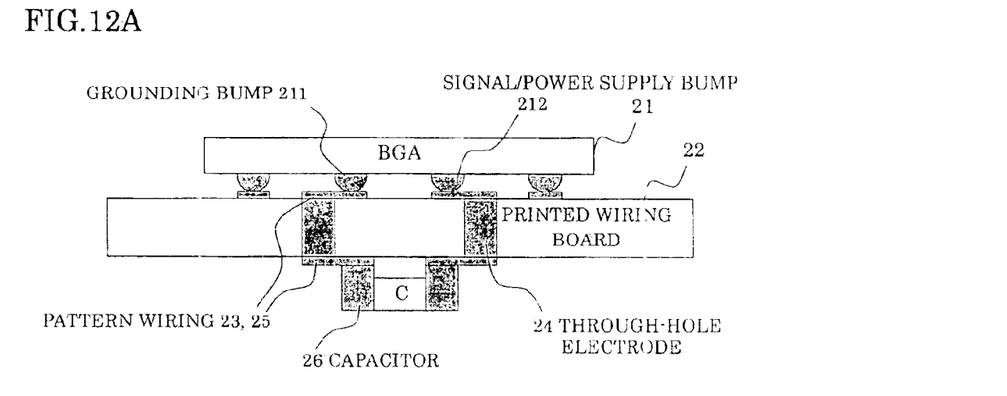
FIGS. 12A–12C are side sectional views showing a prior art example.
Figure 12B:
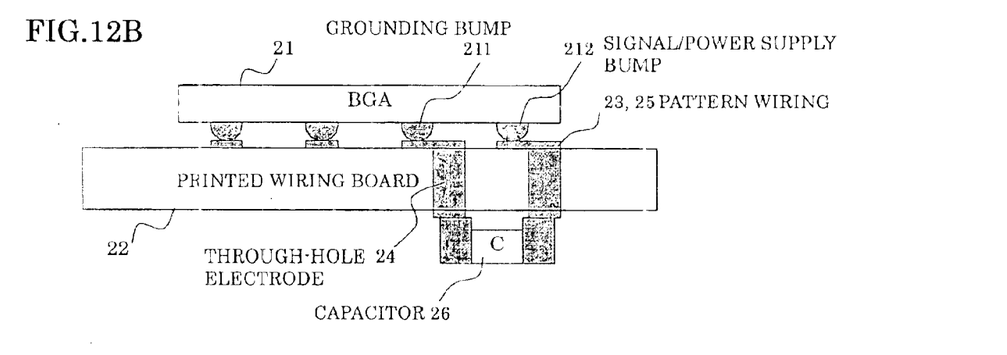
Figure 12C:
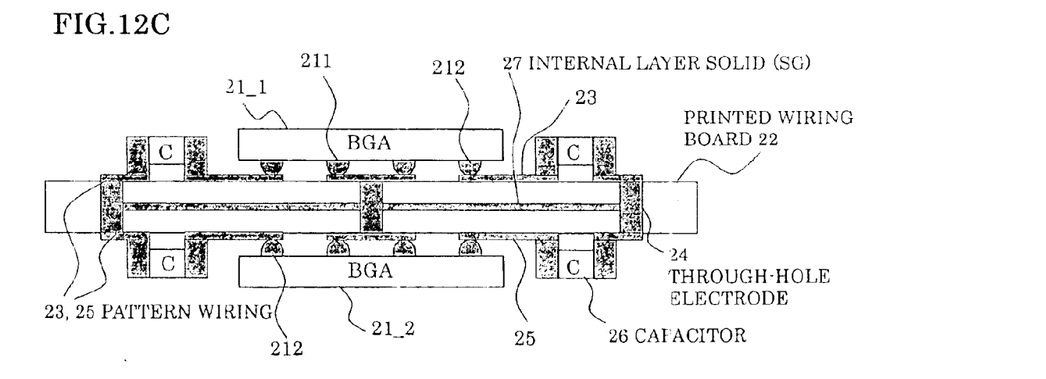

FIGS. 12A–12C show such prior art capacitor mounting technologies.

Firstly in the prior art example shown in FIG. 12A, in order to realize a high-density mounting, an electronic part such as the IC or the LSI uses a ball grid array (hereinafter, abbreviated as BGA) 21 for the circuit substrate. On the BGA 21, a grounding bump (electrode) 211 and a signal/power supply bump 212 are provided downwardly. Through these bumps 211, 212 and a pattern wiring 23 similarly provided upwardly on a printed wiring board 22 as the circuit substrate, signals and power are supplied to the printed wiring board 22.

In order to remove noises from the electronic part, a through-hole (via-hole) electrode 24 is provided within the printed wiring board 22, to which a noise removing capacitor 26 is connected through a pattern wiring 25 provided on the opposite side of the printed wiring board 22 as seen from the BGA 21.

FIG. 12B shows an arrangement in case where the location of the grounding bump 211 and the signal/power supply bump 212 is displaced toward the right side.

Also, in FIG. 12C, BGA's 21_1 and 21_2 are provided on both sides of the printed wiring board 22. In this case, an internal layer solid (SG) 27 is provided within the printed wiring board 22. By this internal layer solid 27, a plurality of through-hole electrodes 24 provided within the printed wiring board 22 are mutually connected. In the example of FIG. 12C, the through-hole electrodes 24 provided on the right and the left ends of the printed wiring board 22 and the capacitors 26 are connected through the pattern wirings 23 and 25 provided between the signal/power supply bumps 212.

However, the pattern wirings 23 and 25 for power supply exist between the BGA's 21 (21_1 and 21_2) and the capacitor 26 in all of the prior art examples shown in FIGS. 12A–12C. Therefore, when the BGA 21 mounts thereon a high-frequency circuit with a short wavelength, such pattern wirings 23 and 25 can not be neglected, and an inductance component by the pattern wirings prevents an effective suppression of a switching noise in a power supply path, which has been a factor of an unstable operation.

Figure 13:
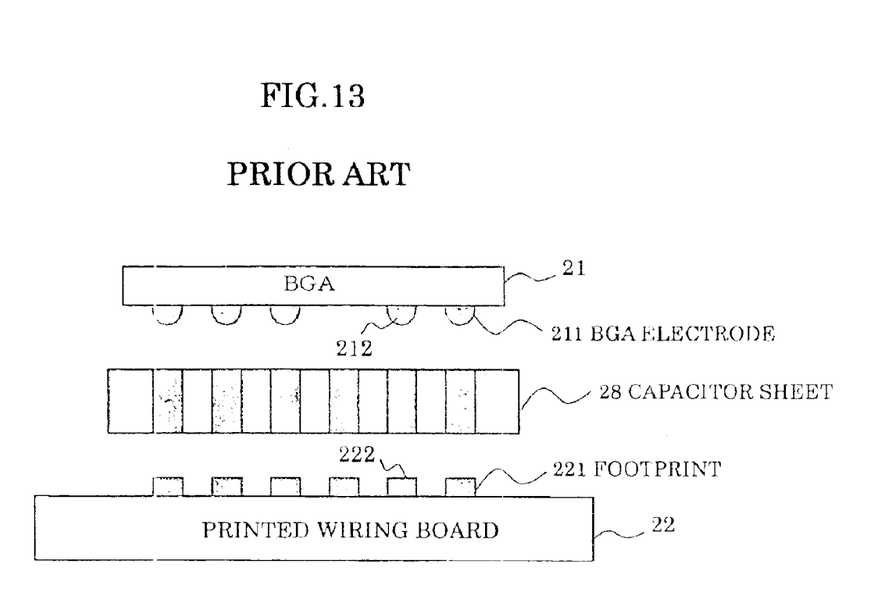
FIG. 13 is a schematic sectional view of a prior art capacitor sheet which is an improved prior art capacitor sheet shown in FIGS. 12A–12C.

As a method of removing the inductance component by the pattern wirings, a conventional technology of sandwiching a capacitor 28 made of high dielectric constant material between the BGA 21 and the printed wiring board 22, as shown in FIG. 13, has also been proposed. It is to be noted that the BGA 21 is connected to the capacitor sheet 28 through the grounding bump (BGA electrode) 211 and the signal/power supply bump 212, and the capacitor sheet 28 is connected to the printed wiring board 22 through a grounding footprint 221 and a signal/power supply footprint 222.

As another conventional technology, there are a bypass capacitor and a formation method thereof wherein a BGA package is mounted on a printed board with a high dielectric constant material sheet sandwiched therebetween, a high dielectric constant material is almost as large as the area in which power supply electrodes and grounding electrodes, within board attaching electrodes provided on the rear surface of a BGA base board of the BGA package are formed, and apertures are formed at parts corresponding to the power supply electrodes and the grounding electrodes so that electrical connection to a BGA mounting pad of the printed board is not blocked (see e.g. patent document 1).

As further conventional technology, there are an integrated circuit device and a capacitor for an integrated circuit wherein :a capacitor is mounted between an integrated circuit chip and a wiring board in an integrated circuit device in which the integrated circuit chip is flip-chip-mounted on the wiring board, the capacitor has a pair of first electrode pads connected to one electrode of the capacitor, and a pair of second electrode pads connected to the other electrode, one of the first electrode pads is connected to a power supply electrode of the integrated circuit chip, the other of the first electrode pads is connected to the power supply terminal of the wiring board respectively, one of the second electrode pads is connected to a grounding terminal of the integrated circuit chip, and the other of the second electrode pads is connected to the grounding terminal of the wiring board respectively (see e.g. patent document 2).

[Patent document 1] Japanese patent application laid-open No.9-102432

[Patent document 2] Japanese patent application laid-open No.2003-124430

In the above-mentioned patent document 1, there is a problem that a power supply point associated with the BGA package is determined, and an electrode location providing a capacitance is fixed.

Also, in the above-mentioned patent document 2, the power supply terminals and the grounding terminals of an IC or an LSI have to be arranged at adjoining or vicinal positions in order to form the capacitor between the first electrode and the second electrode, and there is a possibility that no capacitor can be formed depending on a pin arrangement of the IC or the LSI.

Namely, since a method of providing the capacitance sideward by assigning the power supply and the ground to adjoining two pins in such a conventional capacitor forming technology, only one kind of capacitor lamination is formed, and a capacitor function is performed only in the case of a single power supply of the BGA. Accordingly, in order to accommodate to the case where a plurality of power supplies exist (when e.g. 3.3 V, 1.8 V, and the like are used) in the BGA, a plurality of dielectric layers and a plurality of power supply layers sandwiching the dielectric layers have to be formed, and custom products have to be provided according to kinds of power supplies, which leads to a problem of lacking in flexibility.

SUMMARY OF THE INVENTION

It is accordingly an object of the present invention to provide a capacitor sheet which can flexibly provide a capacitance even when a plurality of power supplies exist.

In order to achieve the above-mentioned object, a capacitor sheet according to the present invention comprises: a first capacitor block having grounding electrodes sandwiching a dielectric including a through-hole electrode to be located apart from the grounding electrodes; and a second capacitor block having grounding electrodes sandwiching a dielectric including a through-hole electrode to be located apart from the grounding electrodes, in which the grounding electrodes are electrically connected with the through-hole electrode, the grounding electrodes of the first capacitor block being electrically connected with the second capacitor block.

Namely, the capacitor sheet according to the present invention is inserted between two circuit boards in the same way as the prior art example shown in FIG. 13. However, this capacitor sheet comprises e.g. a plurality of first capacitor blocks and e.g. a plurality of second capacitor blocks. The first capacitor blocks connect signal/power supply electrodes of e.g. two circuit boards through through-hole electrodes. Since a plurality of first capacitor blocks exist, a plurality of through-hole electrodes exist. Thus, it becomes possible to connect this capacitor sheet to a plurality of signal/power supply electrodes. Since capacitances by dielectrics are formed between the through-hole electrodes and the grounding electrodes provided around the through-hole electrodes, capacitances corresponding to a plurality of signal/power supply electrodes can be flexibly obtained.

Also, in the second capacitor blocks, the through-hole electrodes are connected to grounding electrodes of e.g. two circuit boards and to the grounding electrodes sandwiching the dielectric surrounding the through-hole electrodes through e.g. pattern wirings. Therefore, the through-hole electrodes and the grounding electrodes in the second capacitors have the potential of the grounding electrodes in two circuit boards.

Since the capacitor blocks are arranged and combined to a single piece so that the grounding electrodes of the first capacitor blocks and the second capacitor blocks may be electrically and mutually connected, the grounding electrodes of the first capacitor blocks are connected to the grounding electrodes of the second capacitor blocks. Accordingly, all of the grounding electrodes of this capacitor sheet are connected to the grounding electrodes of two circuit boards, whereby all of the first capacitor blocks can form the capacitances between the through-hole electrodes and the grounding electrodes.

Thus, the capacitor sheet according to the present invention forms the capacitor in one block per electrode of the circuit board, and provides capacitances in a vertical direction between the through-hole electrodes and the grounding electrodes within the block. Therefore, it becomes possible (1) to provide the capacitance according to the kind of the power supply with the same block even when a plurality of power supplies exist on the circuit board, and (2) to flexibly, form the capacitance according to the arrangement of the power supply on the circuit board only by freely changing the arrangement of capacitor blocks.

The above-mentioned capacitor block may comprise either a cube or a rectangular parallelepiped, the through-hole electrode may be provided so as to substantially penetrate a center of two faces of the cube or the rectangular parallelepiped, and the grounding electrodes may be provided at two opposite faces of the cube or the rectangular parallelepiped which do not cross the through-hole electrode.

Namely, the capacitor sheet according to the present invention combines the capacitor blocks of a cube or a rectangular parallelepiped to a single piece or unit, thereby having a rectangular parallelepiped form.

Also, even when adjoining capacitor blocks are mutually combined in the same direction, the grounding electrodes may be provided in the capacitor blocks so that the grounding electrodes of the capacitor blocks are electrically connected.

Namely, when the capacitor blocks of a cube or a rectangular parallelepiped are combined to a single piece or unit, the grounding electrodes can be connected in an aligned form in a fixed direction. If there is at least one second capacitor block in each row, the grounding electrodes of an upper portion and a lower portion in the row become the same grounding electrodes.

Also, even when adjoining capacitor blocks of a cube are mutually rotated 90° to be combined, the grounding electrodes may be provided in the capacitor blocks so that the grounding electrodes of the capacitor blocks are electrically connected with each other.

Namely, since each capacitor block is a cube in this case, even when the capacitor blocks are rotated 90°, the grounding electrodes of the adjoining capacitor blocks can still contact with each other. Since the first capacitor blocks form the capacitance by being perfectly surrounded by the grounding electrodes, stable grounding potential is obtained.

Also, the above-mentioned through-hole electrode of the first capacitor may be a cylinder having a diameter and a length by which a capacitance formed with the grounding electrodes provides a desired value.

Namely, in order to obtain a desired capacitance for the first capacitor block, a diameter and a length of the through-hole electrode may be adjusted.

Also, a plurality of capacitor blocks having the through-hole electrodes whose diameters are different from each other may be arranged in conformity with a desired capacitance.

Namely, if various through-hole electrodes adjusted as mentioned above are used, a desired capacitance can be provided to the circuit board. More specifically, since a waveform rounding occurs if a capacitance is observed in a signal pin except a power supply pin, a distance between the electrodes is made longer by reducing a diameter of the through-hole electrode in a block arranged to the signal pin, whereby a block is assigned in which the capacitance is reduced. By assigning this block, the influence by the capacitance to the signal pin can be avoided.

The capacitor block may comprise a cube or a rectangular parallelepiped of a size in conformity with a desired capacitance.

Namely, by changing a cube form or a rectangular parallelepiped form of each capacitor block, a desired capacitance can be obtained.

Also, if the diameter of the through-hole electrode in the first capacitor block is adjusted, a desired characteristic impedance can be provided.

Namely, by adjusting the through-hole diameter in the signal/power supply capacitor block, it becomes possible to adjust the impedance and to accommodate to the suppression of a signal reflection or the like due to an impedance mismatch.

Also, the capacitor blocks may be arranged so that all or a part of the grounding electrodes are electrically connected with each other.

Namely, as a result of the above, all or a part of the grounding electrodes can be electrically connected with each other, and the same grounding potential can be obtained.

Also, one end of the through-hole electrode may be connected to a BGA, that is one circuit substrate, through a footprint provided thereon, and the other end of the through-hole electrode may be connected to a printed wiring board, that is the other circuit substrate, through a bump provided thereon.

According to the capacitor sheet of the present invention, the capacitor sheet made of the dielectric is sandwiched between the circuit boards such as a BGA or a printed wiring board, and a capacitance is provided to the interval between the through-hole electrode and the grounding electrode in each capacitor block. Therefore, it becomes possible to remove the pattern wiring extending from the capacitor to an element electrode, and to reduce its inductance component.

In this case, pinpoint mounting of the capacitor can be performed to the element electrode, the inductance can be flexibly reduced in a plurality of signal/power supply electrodes, and the switching noise emitted from the printed board can be suppressed. Also, the present invention can contribute to the stability of the signal waveform.

Furthermore, by utilizing this invention for the BGA double-sided mounting shown in the conventional technology, the capacitance can be provided to very close to the element electrode, and high-density mounting can be realized.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which.

DESCRIPTION OF THE EMBODIMENTS

Figure 1A:
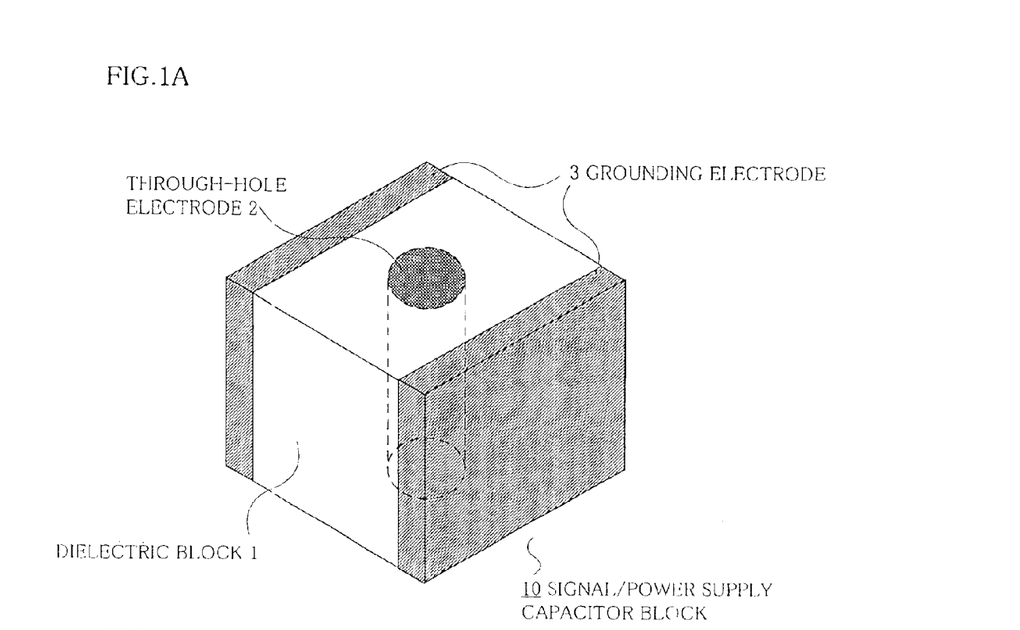
FIGS. 1A and 1B are views showing an embodiment [1] of a signal/power supply capacitor block used for a capacitor sheet according to the present invention.
Figure 1B:
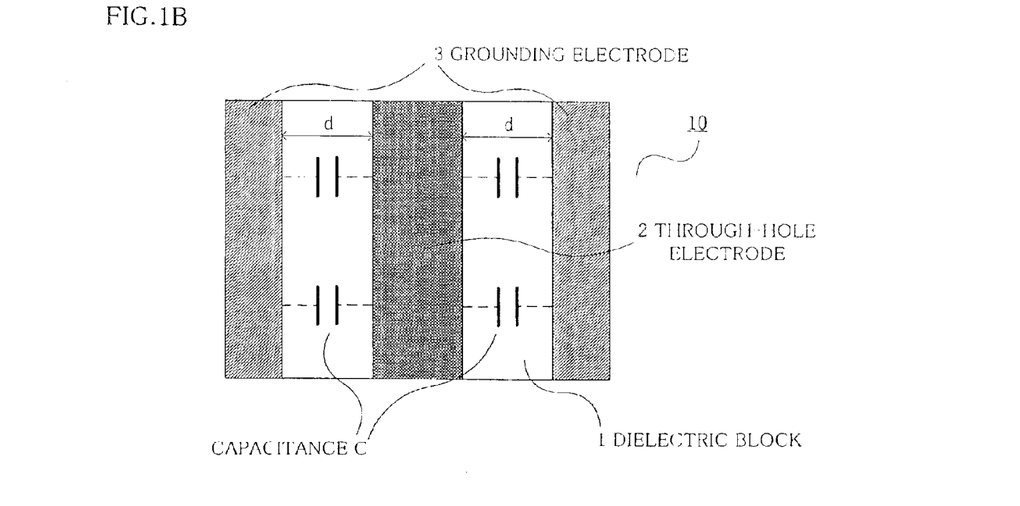

FIGS. 1A and 1B show an embodiment [1] of a signal/power supply capacitor block used for a capacitor sheet according to the present invention. FIG. 1A shows an external view, and FIG. 1B shows an equivalent circuit view.

In FIG. 1A, a signal/power supply capacitor block 10 has a through-hole electrode 2 in a near center of a dielectric block 1 of a cube or a rectangular parallelepiped. On two sides of the dielectric block 1, to which the through-hole electrode 2 is not exposed, grounding electrodes 3 are provided or plated. It is supposed that the through-hole electrode 2 is embedded in the dielectric block 1 by the Pb-plating, or the like.

In the capacitor block 10, as shown in an equivalent circuit view of FIG. 1B, a capacitance C is formed between the through-hole electrode 2 and the grounding electrodes 3. The capacitance C is formed in upward and downward direction, i.e. a vertical direction of the figure.

The capacitance in this case can be schematically obtained based on the following equation.

$$C = \epsilon_o \times \epsilon_r \times S / d \qquad \text{Eq. (1)}$$

$\epsilon_o = 8.854 \times 10^{-12}$ (dielectric constant in vacuum)
$\epsilon_r$ = material dielectric constant
d = distance between electrodes
S = area between electrodes Namely, it is indicated that the capacitance C is determined by the dielectric constant $\epsilon_r$ of the dielectric block 1, the dielectric constant $\epsilon_o$ in the vacuum, the distance d between electrodes, and the area S between electrodes. Accordingly, it is recognized that the shorter the distance d between electrodes becomes, the more the capacitance C increases. Also, the capacitance C can be similarly increased by using a material of a higher dielectric constant as the material of the dielectric block 1.

Figure 2:
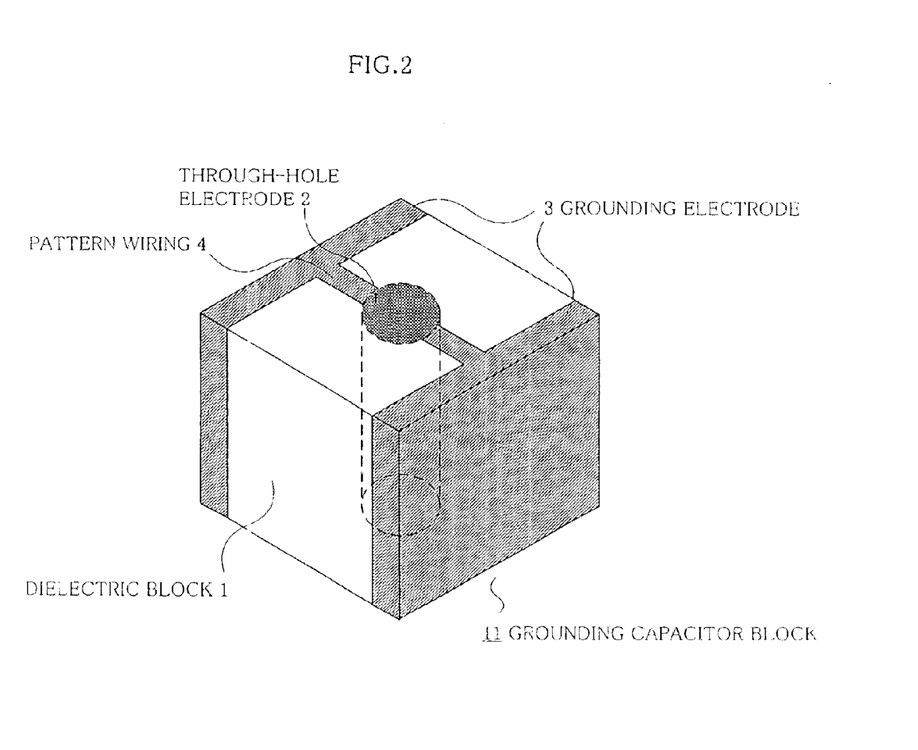
FIG. 2 is a perspective view showing an embodiment of a grounding capacitor block used for a capacitor sheet according to the present invention.

FIG. 2 shows an embodiment of a grounding capacitor block 11 used for the capacitor sheet according to the present invention. In this embodiment, the grounding capacitor block 11 is realized by providing a pattern wiring 4 connecting the grounding electrodes 3 provided on both sides of the dielectric block 1 through the through-hole electrode 2, for the signal/power supply block capacitor 10 shown in FIG. 1A. Thus, in the grounding capacitor block 11, the through-hole electrode 2, the pattern wiring 4, and the grounding electrode 3 are at the same potential (grounding potential).

It is to be noted that the capacitor blocks 10 and 11 may be not only a cube or a rectangular parallelepiped, but also a cylinder concentric with the through-hole electrode.

Figure 3A:
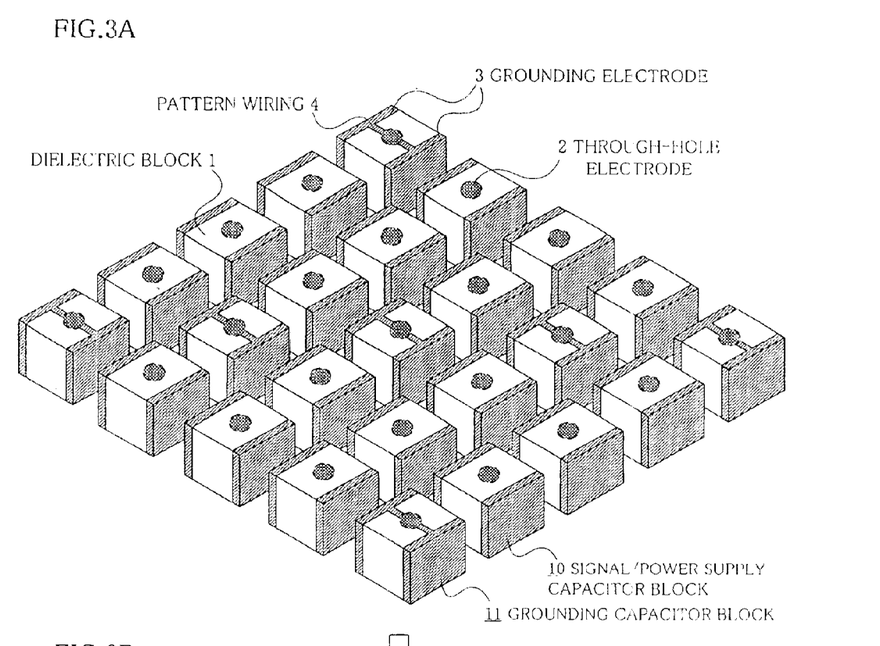
FIGS. 3A and 3B are perspective views showing an embodiment [1] of a capacitor sheet according to the present invention.

FIGS. 3A and 3B show an embodiment [1] of the capacitor sheet according to the present invention. In this embodiment, as shown in FIG. 3A, a plurality of signal/power supply capacitor blocks 10 shown in FIG. 1A and a plurality of grounding capacitor blocks 11 shown in FIG. 2 are arranged. In this example, the grounding capacitor blocks 11 are arranged at the four corners and on one of the diagonal lines. At the remaining positions of the capacitor blocks, the signal/power supply capacitor blocks 10 are arranged. It is to be noted that each capacitor block in this case may be either a cube or a rectangular parallelepiped.

Figure 3B:
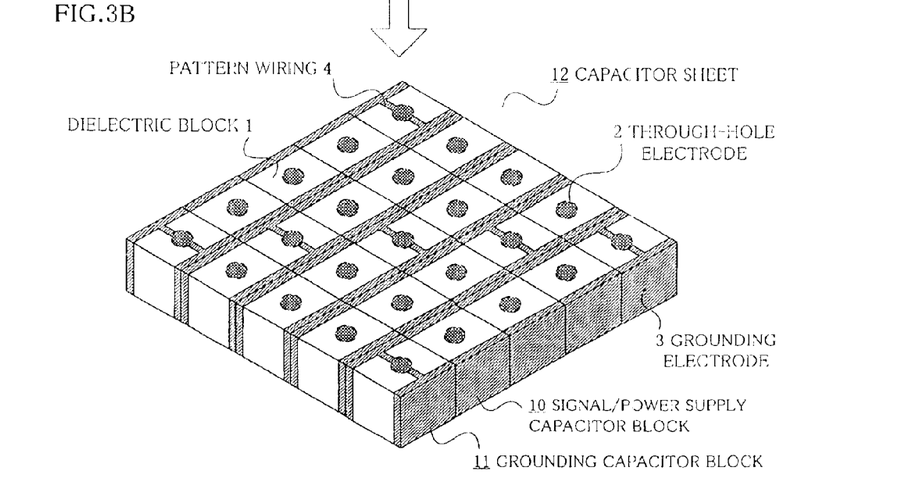

As shown in FIG. 3B, the capacitor blocks 10 and 11 are combined to a single piece, so that the capacitor sheet 12 can be obtained. Thus, the grounding electrodes 3 of the capacitor blocks 10 and 11 are commonly connected to the grounding potential. However, all of the grounding electrodes need not be connected to the grounding potential, as long as the grounding electrodes 3 of the signal/power supply capacitor block 10 are connected to the grounding electrodes 3 of the grounding capacitor block 11 in some form.

It is to be noted that the grounding electrodes 3 have a thickness enabling a mutually good contact resistance.

Figure 4:
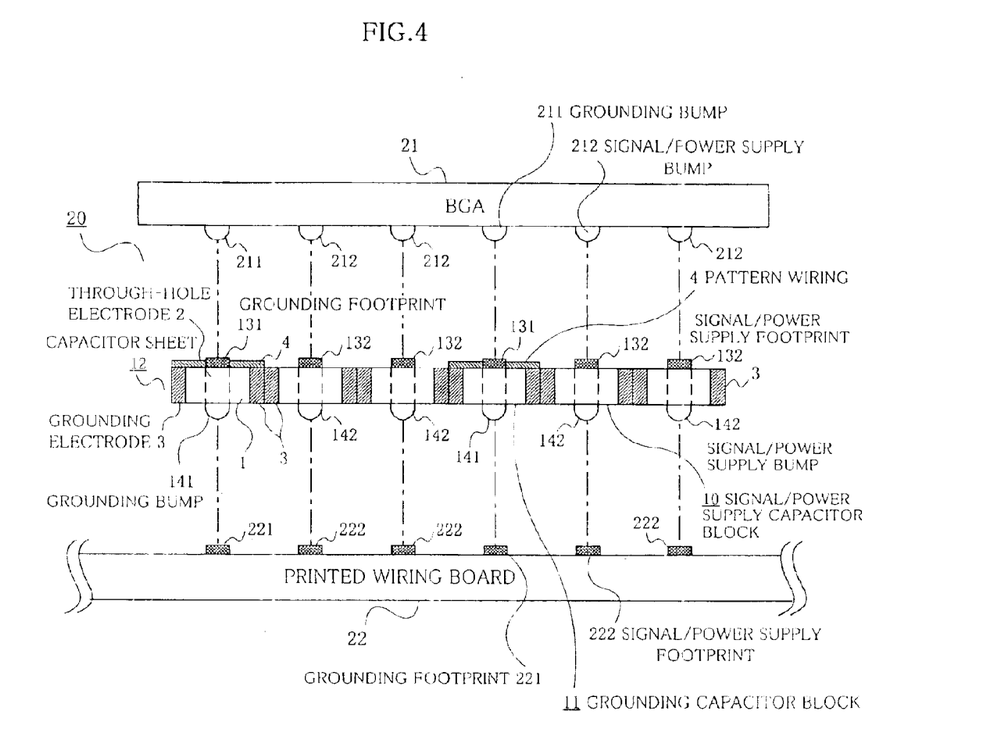
FIG. 4 is a partly sectional side view showing an example of a usage form of a capacitor sheet according to the present invention.

FIG. 4 shows an example of a usage form of the capacitor sheet 12 obtained as indicated in FIG. 3B. While this example does not show the capacitor sheet 12 of FIG. 3B itself, the capacitor sheet 12, in which the grounding capacitor blocks 11 are arranged at the left end and in the fourth block from the left, and the signal/power supply capacitor blocks 10 are arranged in other blocks, is connected between the BGA 21 and the printed wiring board 22.

Thus, the capacitor sheet 12 mounts grounding footprints 131 on the tops of the through-hole electrodes 2 as to the grounding capacitor blocks 11, and mounts signal/power supply footprints 132 on the tops of the through-hole electrodes 2 as to other signal/power supply capacitor blocks 10. The grounding footprints 131 are connected to grounding bumps 211 of the BGA 21, and the signal/power supply footprints 132 are connected to signal/power supply bumps 212 of the BGA 21.

On the bottom face of the capacitor sheet 12, grounding bumps 141 are provided for the through-hole electrodes 2 as to the grounding capacitor blocks 11, and signal/power supply bumps 142 are provided for the through-hole electrodes 2 as to the other signal/power supply capacitor blocks 10 similar to the footprints 131 and 132. Thus, the grounding bumps 141 are connected to the grounding footprints 221 of the printed wiring board 22, and the other signal/power supply bumps 142 are connected to the signal/power supply footprints 222 of the printed wiring board 22.

Figure 5A:
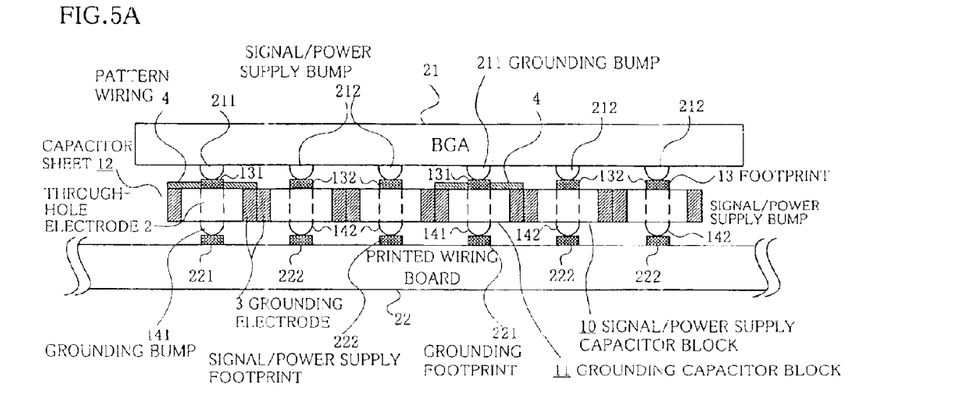
FIGS. 5A–5C are views for further illustrating a usage form of a capacitor sheet shown in FIG. 4.
Figure 5B:
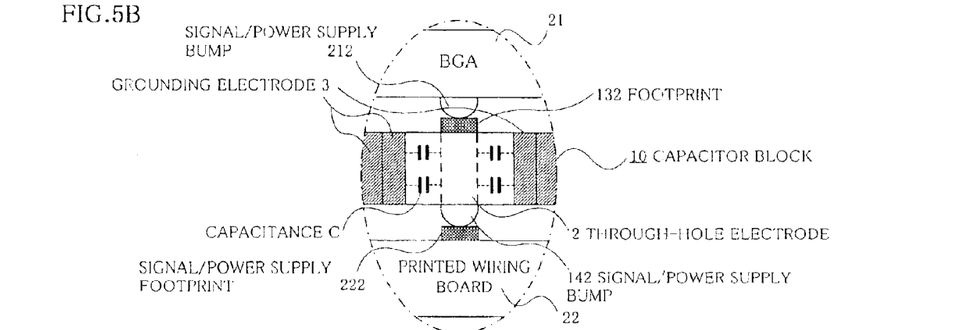

FIG. 5A shows the BGA 21, the capacitor sheet 12, and the printed wiring board 22 thus connected. Furthermore, FIG. 5B shows a view in which a part of the capacitor sheet 12 connected between the BGA 21 and the printed wiring board 22 in this way is enlarged by focusing on the signal/power supply capacitor block 10. Namely, in the same way as the case of FIG. 1B, the capacitances C are formed in a vertical direction between the through-hole electrode 2 and its surrounding grounding electrodes 3 of the signal/power supply capacitor block 10.

Figure 5C:
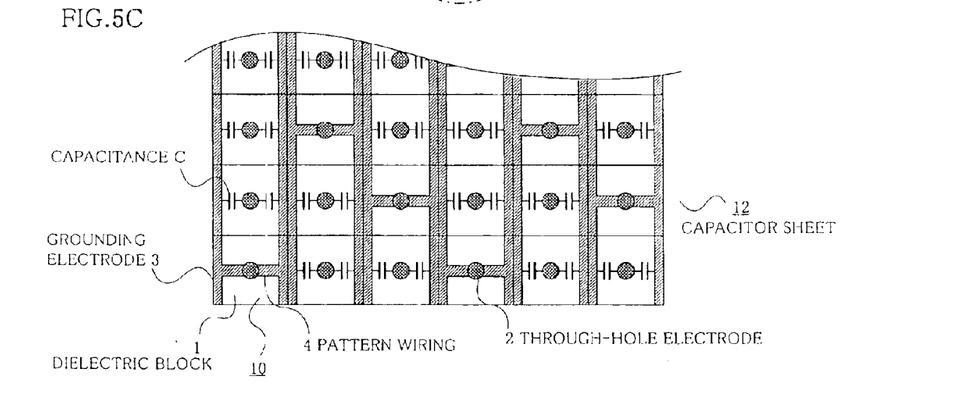

When the thus arranged capacitor sheet 12 from which the BGA 21 is removed is observed from the top, the capacitor sheet 12 in which the capacitances C are formed as equivalent circuits as shown in FIG. 5C is realized. Namely, the respective grounding electrodes 3 of the grounding capacitor blocks 11 and the signal/power supply capacitor blocks 10 are commonly connected, and it is recognized that only at the signal/power supply capacitor blocks 10, the capacitances C are respectively formed as shown FIG. 5C.

Thus, it becomes possible to form the capacitor between the through-hole electrodes 2 and the grounding electrodes 3, and to equally provide the capacitances C to electrode pins of the BGA 21 and of the printed wiring board 22.

Figure 6A:
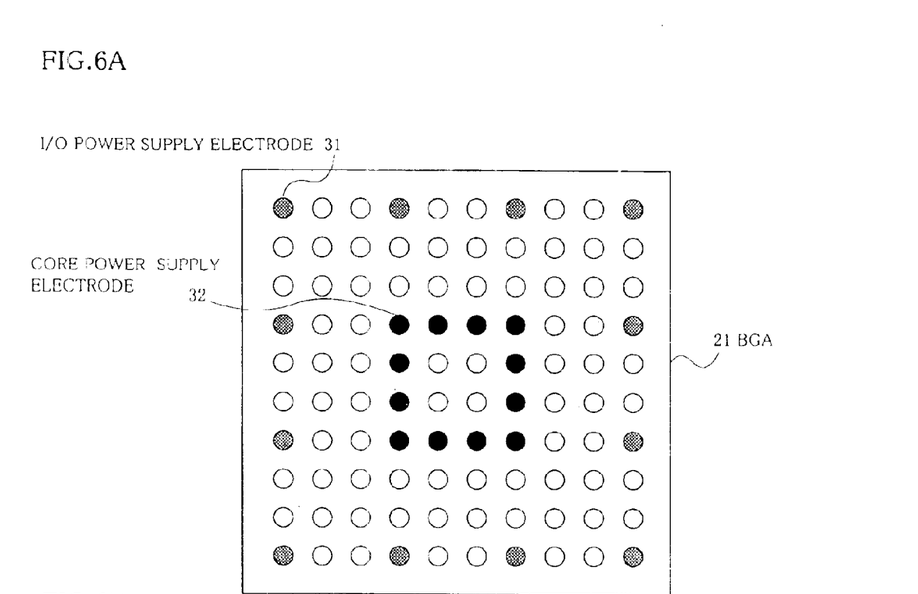
FIGS. 6A and 6B are views showing an embodiment [2] of a capacitor sheet according to the present invention.
Figure 6B:
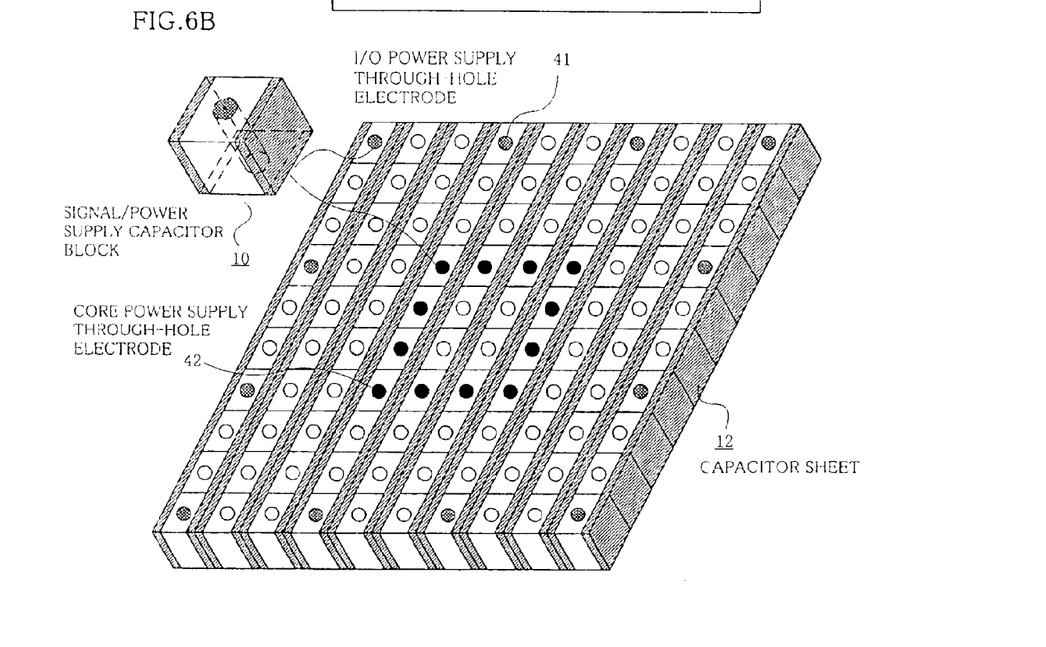

FIGS. 6A and 6B show an embodiment [2] of the capacitor sheet according to the present invention. In this embodiment, according to an FPGA pin arrangement of the BGA 21 as shown in FIG. 6A, capacitor blocks are arranged as shown in FIG. 6B.

Namely, when a plurality of power supplies whose supply voltage values to an I/O power supply 31 and a core power supply 32 are different from each other are supplied to the BGA 21 used for the FPGA, the capacitor sheet 12 according to the present invention, arranges the through-hole electrodes 2 in the signal/power supply capacitor blocks 10 at the positions indicated by hatched circles in FIG. 6B for the I/O power supply 31 indicated by the same hatched circles in FIG. 6A while the signal/power supply core capacitor blocks 10 are arranged at the positions indicated by black circles in FIG. 6B for the core power supply 32 indicated by the same black circles in FIG. 6A, wherein both capacitor blocks are connected respectively corresponding to the power supplies 31 and 32.

Thus, an equal capacitance can be provided to each electrode pin of the BGA 21. Accordingly, as shown in FIG. 6B, even when a plurality of power supplies are supplied from the electrodes 31 and 32 to the BGA 21, it becomes possible to equally provide the capacitance to each electrode pin, and to easily form the capacitor sheet 12 by using the capacitor block of the same form. By this capacitor sheet 12, the pattern wiring is eliminated for a plurality of power supplies, so that the switching noise can be effectively reduced.

Figure 7A:
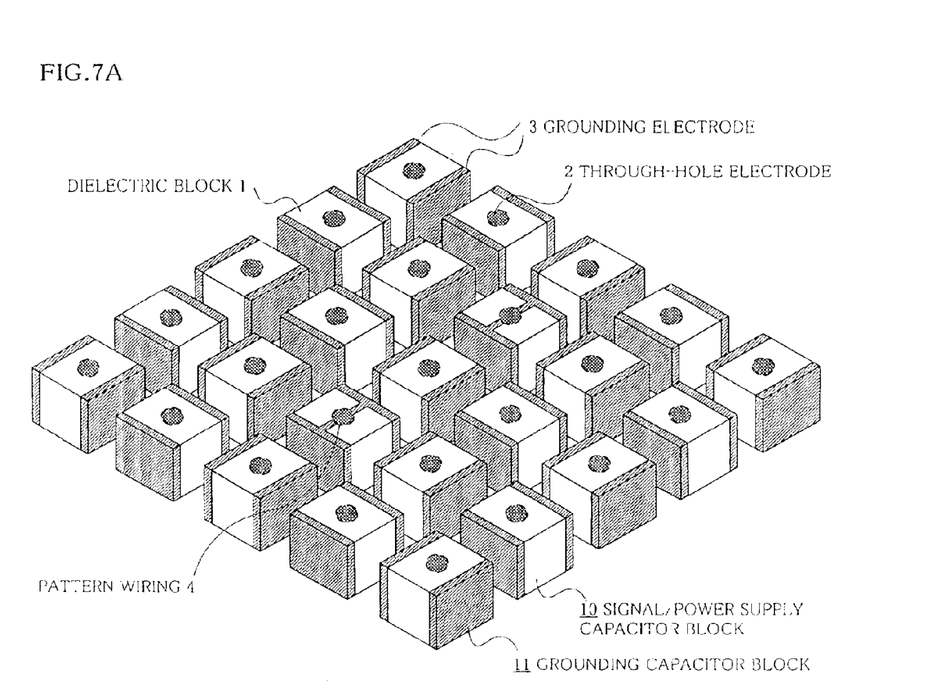
FIGS. 7A and 7B are perspective views showing an embodiment [3] of a capacitor sheet according to the present invention.
Figure 7B:
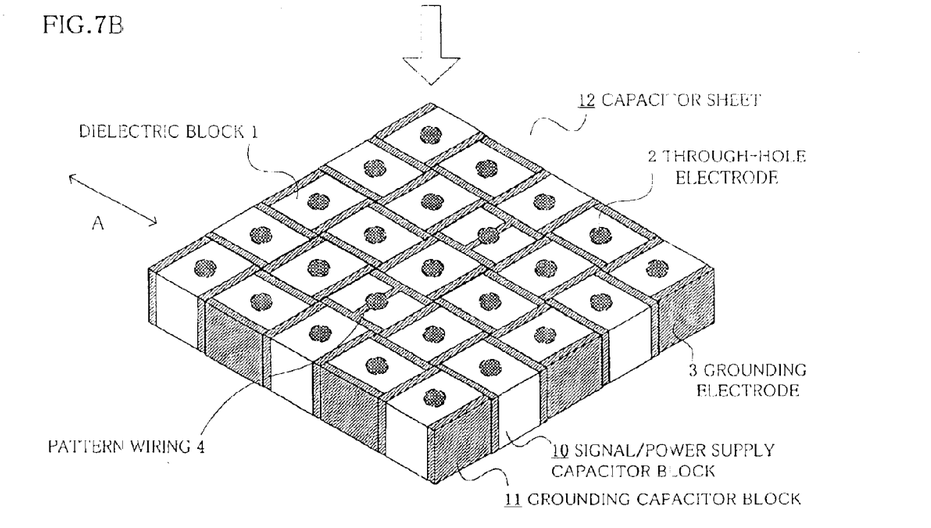

FIGS. 7A and 7B show an embodiment [3] of the capacitor sheet according to the present invention. In this embodiment, the adjoining capacitor blocks in the embodiment [1] shown FIGS. 3A and 3B are mutually rotated 90° to be combined, thereby forming a single capacitor block (sheet) 12. It is to be noted that the capacitor block in this case is a cube form.

If any capacitor block in a row parallel to the direction of an arrow A forms the grounding capacitor block 11 by rotating adjoining capacitor blocks 90° in this embodiment in the same way as FIG. 3B, the grounding electrodes 3 in all of the capacitor blocks are to be connected to the ground. However, in the example of FIGS. 7A and 7B, it is indicated that at least two capacitor blocks may form the grounding capacitor block 11. Accordingly, depending on the direction in which the adjoining capacitor blocks are rotated 90°, it is required to make another capacitor block to be a grounding capacitor block.

In this embodiment, all directions of the through-hole electrode can be surrounded by the grounding electrodes for a single capacitor block, and the grounding potential can be more stabilized. It is to be noted that even if the grounding electrode 3 is rotated 90°, the thickness which makes the good electrical contact resistance is obtained.

Figure 8A:
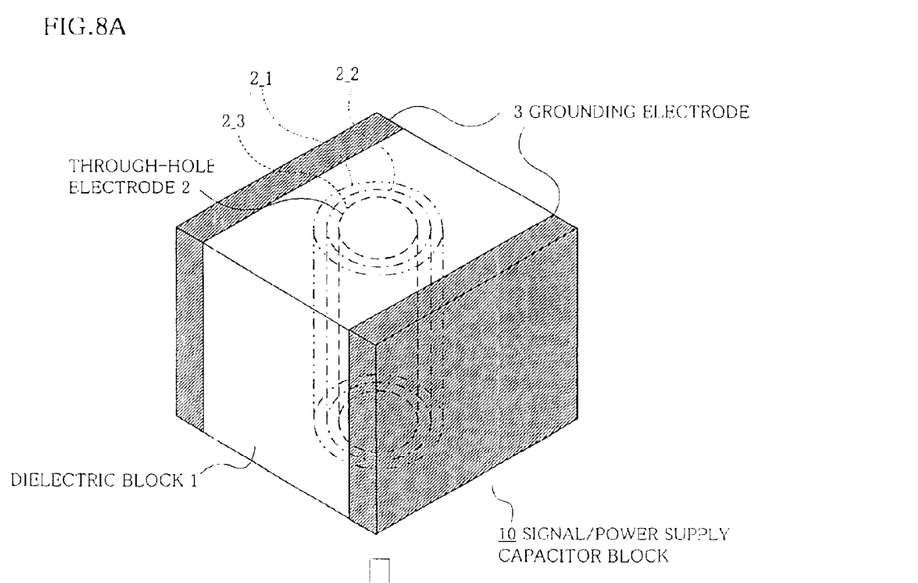
FIGS. 8A and 8B are views showing an embodiment [2] of a signal/power supply capacitor block used for a capacitor sheet according to the present invention.
Figure 8B:
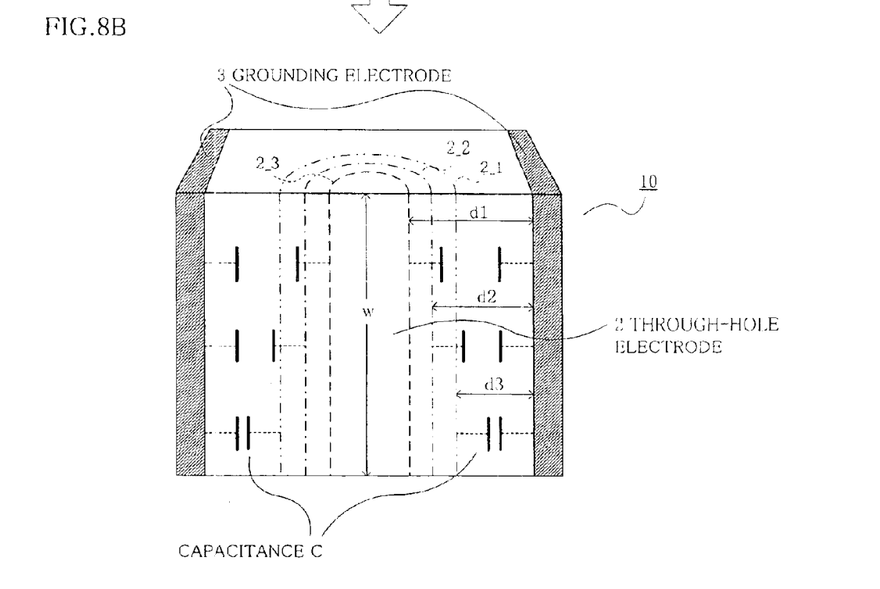

FIGS. 8A and 8B show the embodiment [2] of the signal/power supply capacitor block used for the capacitor sheet according to the present invention. Firstly, FIG. 8A shows a view assuming that the through-hole electrode 2 changes to through-hole electrodes 2_1–2_3 as three modes. Corresponding to these electrodes, FIG. 8B shows a perspective view of the front in the case where the through-hole electrode 2 has three patterns.

Namely, as indicated in the above. Equation (1), when the distance d between electrodes is changed from d1 to d3, the capacitance C assumes the largest when the distance between electrodes is d3. Therefore, it is recognized that according to the distance between electrodes or a diameter of the through-hole electrode 2, various capacitor blocks 10 can be selected. As to the length of the through-hole electrode 2, i.e. the thickness of the capacitor block 10, various capacitor blocks 10 can be selected similarly according to the Equation (1). Also, even when the size of the capacitor block 10 (area (length×width) of face to which the through-hole electrode 2 is exposed) is changed, various capacitor blocks 10 can be selected similarly.

Figure 9A:
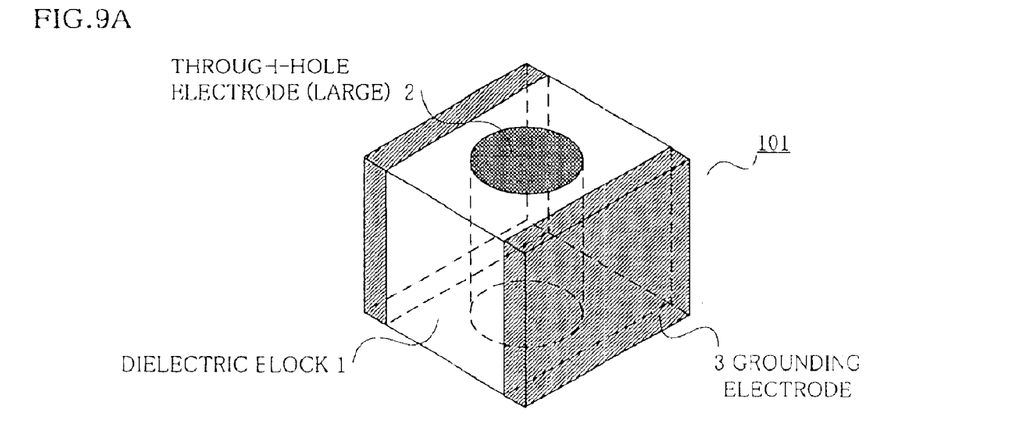
FIGS. 9A–9C are perspective views showing various usages corresponding to an embodiment [2] of a capacitor block shown in FIGS. 8A and 8B.
Figure 9B:
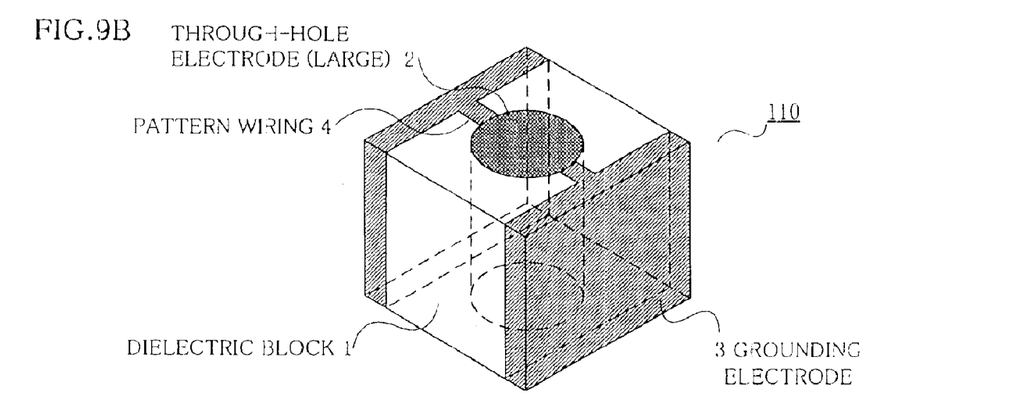
Figure 9C:
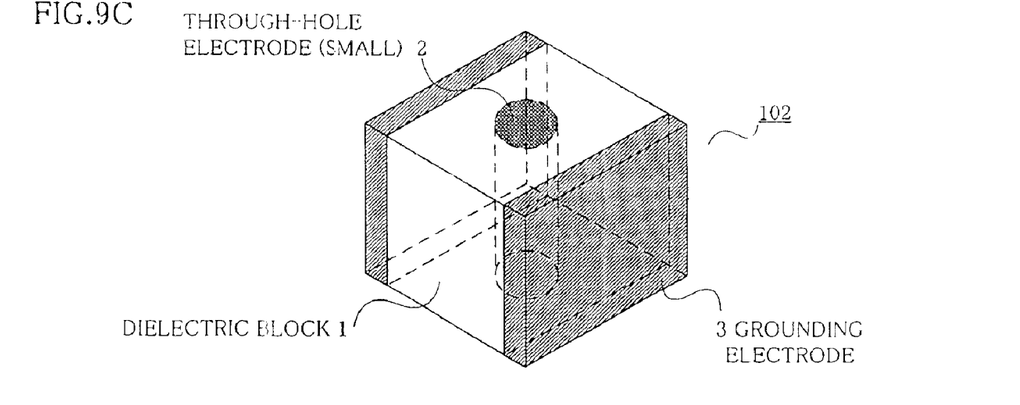

FIGS. 9A–9C show various capacitor blocks shown in FIGS. 8A and 8B according to the applications. The capacitor block 101 of FIG. 9A makes the distance d between electrodes shorter by increasing the diameter of the through-hole electrode 2, and is used for the power supply electrode capacitor block. Also, in case of a block 110 in FIG. 9B, the pattern wiring 4 is connected between the grounding electrode 3 and the through-hole electrode 2 in the power supply electrode capacitor block 101 of FIG. 9A. The capacitor block 110 is used for the grounding electrode capacitor block 11 whose connection resistance is low. Furthermore, as shown in FIG. 9C, the distance d between electrodes is made longer by decreasing the diameter of the through-hole electrode 2, so that the capacitance is decreased and the capacitor block 102 is used for the signal electrode capacitor block 10.

Namely, when the capacitance C appears, a waveform rounding or the like occurs in the signal electrode capacitor block 10. Therefore, in order to provide as little capacitance as possible, the diameter of the through-hole electrode 2 is decreased in order to increase the distance d between electrodes.

It is needless to say that as shown in the above Equation (1), the capacitance can be adjusted by changing the dielectric material and the outer dimension of the capacitor block.

Figure 10A:
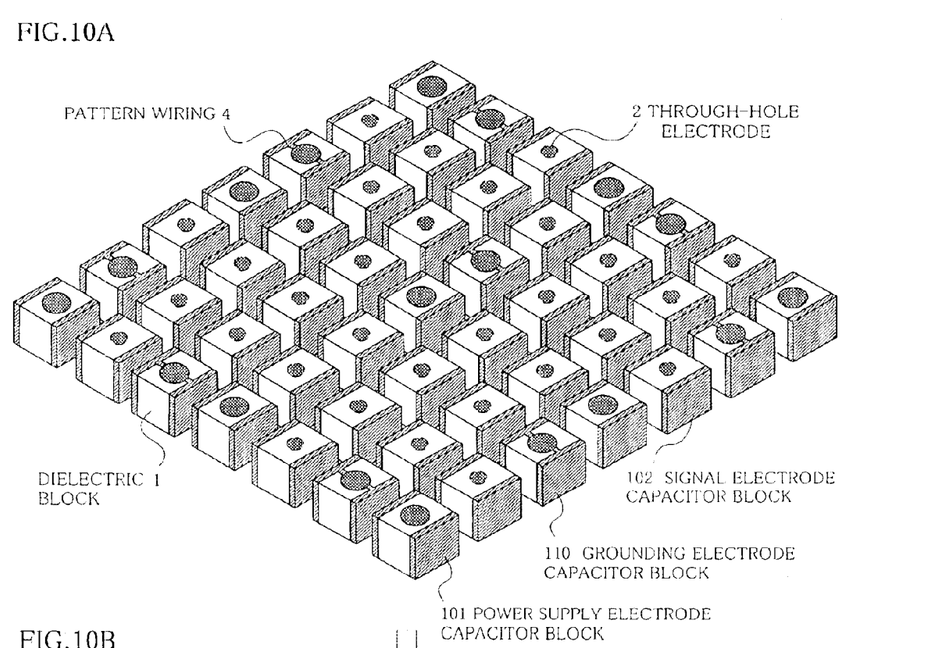
FIGS. 10A and 10B are perspective views showing an embodiment [4] of a capacitor sheet according to the present invention.
Figure 10B:
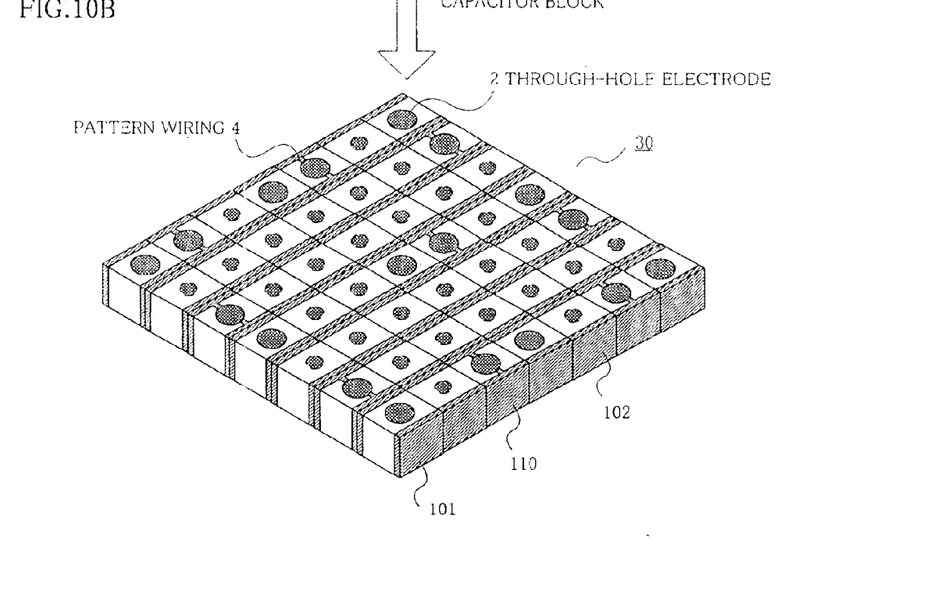

FIGS. 10A and 10B show an embodiment [4] of the capacitor sheet using the various capacitor blocks shown in FIGS. 9A–9C.

Namely, a plurality of power supply electrode capacitor blocks 101 shown in FIG. 9A, grounding electrode capacitor blocks 110 shown in FIG. 9B, and signal electrode capacitor blocks 102 shown in FIG. 9C are arranged as shown in FIG. 10A, and are combined to a single sheet form as shown in FIG. 10B. Thus, a large capacitance can be provided only for the power supply electrode capacitor blocks 101 without being provided for the signal electrode capacitor blocks 102, thereby enabling the noise to be effectively suppressed per electrode pin.

Figure 11:
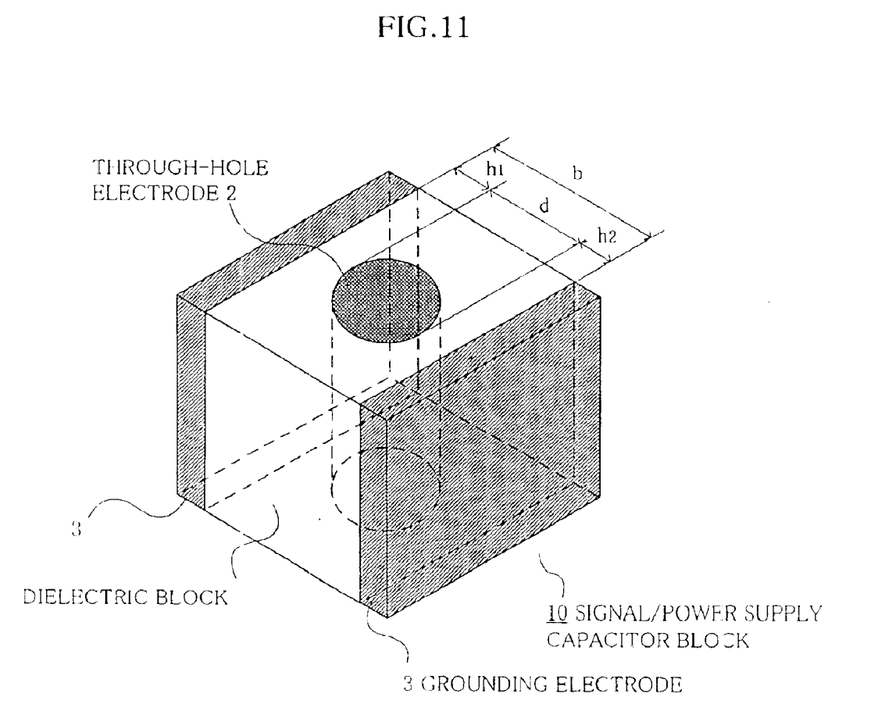
FIG. 11 is a perspective view showing an embodiment [3] of a signal/power supply capacitor block used for a capacitor sheet according to the present invention.

FIG. 11 shows an embodiment [3] of the signal/power supply capacitor block used for the capacitor sheet according to the present invention. In this embodiment, a stripline arrangement realized by grounding the grounding electrode 3 is noticed, whereby an impedance control can be performed to the through-hole electrode 2 by adjusting distances h1 and h2 between the through-hole electrode 2 and the grounding electrode 3 as well as the diameter d of the through-hole electrode 2, and a desired characteristic impedance can be obtained.

What we claim is:

1. A capacitor sheet comprising:
   a first capacitor block having grounding electrodes sandwiching a dielectric including a through-hole electrode to be located apart from the grounding electrodes; and
   a second capacitor block having grounding electrodes sandwiching a dielectric including a through-hole electrode to be located apart from the grounding electrodes, in which the grounding electrodes are electrically connected with the through-hole electrode, the grounding electrodes of the first capacitor block being electrically connected with the second capacitor block.

2. The capacitor sheet as claimed in claim 1 wherein each capacitor block comprises either a cube or a rectangular parallelepiped, the through-hole electrode is provided so as to substantially penetrate a center of two faces of the cube or the rectangular parallelepiped, and the grounding electrodes are provided at two opposite faces of the cube or the rectangular parallelepiped which do not cross the through-hole electrode.

3. The capacitor sheet as claimed in claim 2 wherein even when adjoining capacitor blocks are mutually combined in the same direction, the grounding electrodes are provided in the capacitor blocks so that the grounding electrodes of the capacitor blocks are electrically connected.

4. The capacitor sheet as claimed in claim 2 wherein even when adjoining capacitor blocks of a cube are mutually rotated 90° to be combined, the grounding electrodes are provided in the capacitor blocks so that the grounding electrodes of the capacitor blocks are electrically connected.

5. The capacitor sheet as claimed in claim 1 wherein the through-hole electrode of the first capacitor is a cylinder having a diameter and a length by which a capacitance formed with the grounding electrodes provides a desired value.

6. The capacitor sheet as claimed in claim 5 wherein a plurality of capacitor blocks having the through-hole electrodes whose diameters are different from each other are arranged in conformity with a desired capacitance.

7. The capacitor sheet as claimed in claim 5 wherein the first capacitor block comprises a cube or a rectangular parallelepiped of a size in conformity with a desired capacitance.

8. The capacitor sheet as claimed in claim 1 wherein the first capacitor block has a through-hole electrode of a diameter by which a desired characteristic impedance is provided.

9. The capacitor sheet as claimed in claim 1 wherein the capacitor blocks are arranged so that all or a part of the grounding electrodes are electrically connected.

10. The capacitor sheet as claimed in claim 1 wherein one end of the through-hole electrode is connected to a BGA, which is one circuit substrate, through a footprint provided thereon, and the other end of the through-hole electrode is connected to a printed wiring board, which is the other circuit substrate, through a bump provided thereon.

* * * * *